United States Patent
Chuang et al.

(10) Patent No.: US 8,845,842 B2
(45) Date of Patent: Sep. 30, 2014

(54) METHOD FOR MANUFACTURING CIRCUIT BOARD USING ELECTRICALLY CONDUCTIVE PARTICLES AND CIRCUIT BOARD MANUFACTURED BY THE METHOD

(75) Inventors: Tsung-Jen Chuang, New Taipei (TW);
Shih-Fang Wong, New Taipei (TW);
Jiang-Feng Shan, Shenzhen (CN);
Lin-Kun Ding, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 245 days.

(21) Appl. No.: 13/340,591

(22) Filed: Dec. 29, 2011

(65) Prior Publication Data

US 2013/0025921 A1 Jan. 31, 2013

(30) Foreign Application Priority Data

Jul. 29, 2011 (CN) .......................... 2011 1 10215418

(51) Int. Cl.
*H05K 1/02* (2006.01)
*H05K 3/10* (2006.01)
*H05K 3/46* (2006.01)

(52) U.S. Cl.
CPC ................ *H05K 3/10* (2013.01); *H05K 3/4611* (2013.01); *H05K 2203/0557* (2013.01); *H05K 2203/105* (2013.01)
USPC ..................................................... 156/272.2

(58) Field of Classification Search
USPC ......... 156/272.2, 182; 427/540; 174/259, 250
See application file for complete search history.

*Primary Examiner* — Daniel McNally
(74) *Attorney, Agent, or Firm* — Novak Druce Connolly Bove + Quigg LLP

(57) ABSTRACT

An exemplary method for manufacturing a circuit board includes, firstly, obtaining an insulating substrate, liquid heat-curable adhesive and electrically conductive particles. The electrically conductive particles are added into the liquid heat-curable adhesive. The electrically conductive particles in the heat-curable adhesive are activated by electrical discharge. Secondly, the liquid heat-curable adhesive having activated electrically conductive particles are spread on the insulating substrate to form a heat-curable adhesive layer on the insulating substrate. Thirdly, the heat-curable adhesive layer are exposed to the mid-infrared light by using a photo-mask, the photo-mask has a pattern corresponding to a desired circuit pattern of the circuit board. The electrically conductive particles relocated themselves one by one to form the circuit pattern under irradiation by the mid-infrared light. Finally, the heat-curable adhesive layer are hardening.

11 Claims, 5 Drawing Sheets

METHOD FOR MANUFACTURING CIRCUIT BOARD USING ELECTRICALLY CONDUCTIVE PARTICLES AND CIRCUIT BOARD MANUFACTURED BY THE METHOD

BACKGROUND

1. Field of the Disclosure

The present disclosure generally relates to circuit boards and methods for manufacturing circuit boards, and particularly to a circuit board with electrically conductive particles.

2. Description of Related Art

Typical consumer electronic products are required to have light, thin, short, and small structures in addition to powerful functions. Circuit boards are the core components of many electronic products, and normally are designed to have a multilayer structure in order to achieve high integration and a small vertical profile. The multilayer structure may be two layers, or six layers, or eight layers, or even more than ten layers.

Referring to FIG. 4, a typical multilayer circuit board 100 includes three insulating layers 101, 104 and 107, and four circuit pattern layers 105, 106, 108 and 109. The four circuit pattern layers 105, 106, 108 and 109 and three insulating layers 101, 104 and 107 are stacked and sandwiched together in alternating fashion. That is, the four circuit pattern layers 105, 106, 108 and 109 are disposed on surfaces of the three insulating layers 101, 104 and 107, with every two adjacent circuit pattern layers 105, 106, 108 and 109 being separated by a corresponding insulating layer 101, 104 or 107. A through hole 110 can be defined in the circuit board 100, and a wall of the through hole 110 can be coated with electrically conductive material to form a via. The via thereby electrically interconnects the two outermost circuit pattern layers 105 and 109.

Referring also to FIG. 5, a typical method for forming a circuit pattern on an insulating layer includes the following steps.

In step S20, an insulating layer is provided, and a copper layer and a photo-resist layer are formed on one side of the insulating layer.

In step S21, the photo-resist layer is exposed using a photo-mask, and then developed, thereby forming a photo-resist pattern, with the photo-resist pattern exposing unwanted portions of the copper layer.

In step S22, the exposed portions of the copper layer are etched away, thereby forming a circuit pattern.

During the process of manufacturing the circuit board, a lot of etching liquid or etching gas is used to etch the copper layer. These etching substances are corrosive, thus resulting in the need to provide systems for avoiding environmental pollution.

What is needed, therefore, is a method which can overcome the described limitations and an associated circuit board made by such method.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the various views, and all the views are schematic.

DETAILED DESCRIPTION

Reference will be made to the drawings to describe exemplary embodiments in detail.

Figure 1:
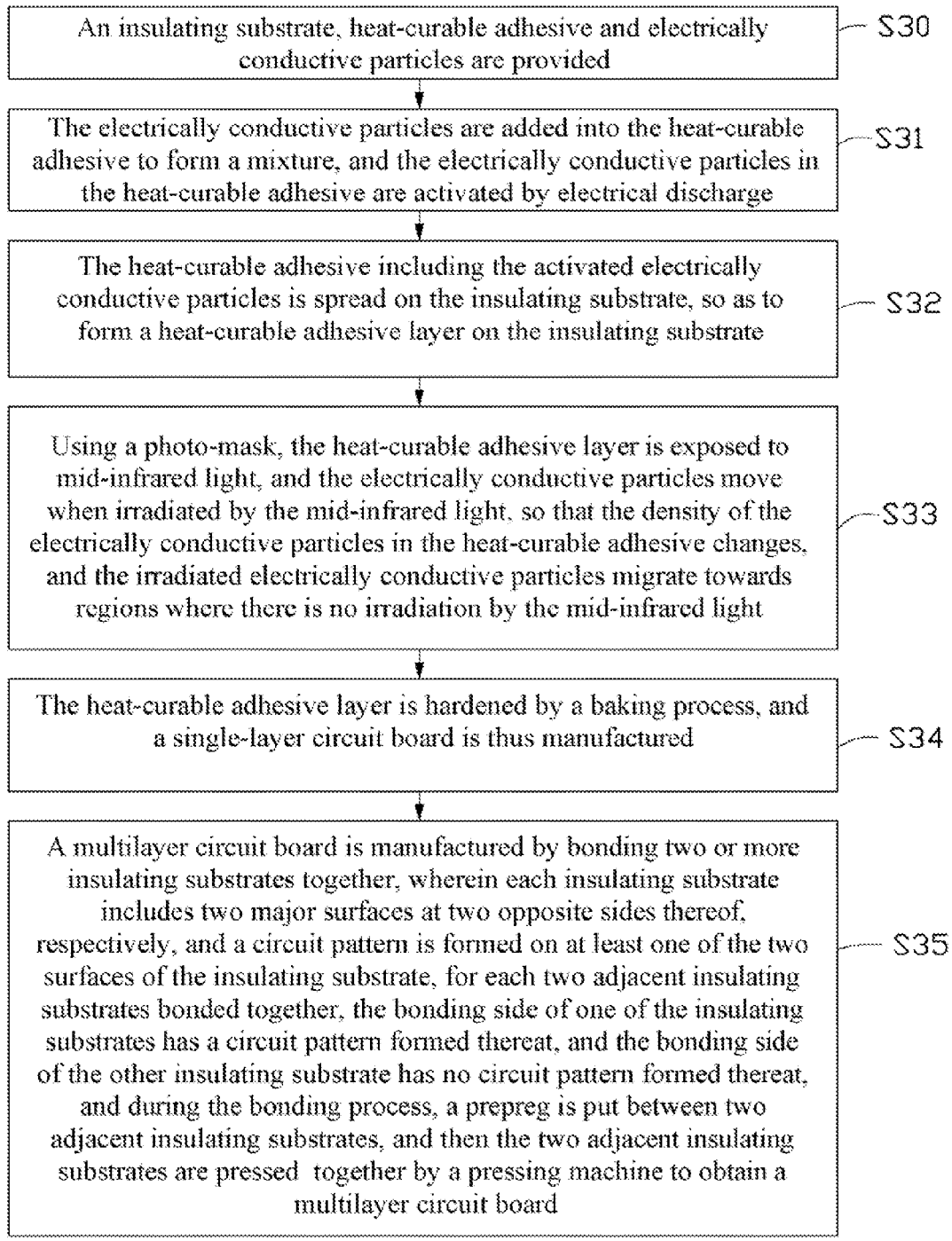
FIG. 1 is a flowchart summarizing a method for fabricating a multilayer circuit board according to an exemplary embodiment of the present invention.

Referring to FIG. 1, a flowchart summarizing a method for manufacturing a multilayer circuit board according to an exemplary embodiment of the present invention is shown. The manufacturing steps are described in detail below.

In step S30, an insulating substrate, heat-curable adhesive, and electrically conductive particles are provided. The heat-curable adhesive is liquid before heating.

In step S31, the electrically conductive particles are added into the heat-curable adhesive to form a mixture, and the electrically conductive particles in the heat-curable adhesive are activated by electrical discharge. For example, a voltage differential is applied across a container holding the mixture such that electrical current passes through the mixture and activates the electrically conductive particles.

In step S32, the heat-curable adhesive including the activated electrically conductive particles is spread on the insulating substrate, so as to form a heat-curable adhesive layer on the insulating substrate.

In step S33, using a photo-mask, the heat-curable adhesive layer is exposed to mid-infrared light. The mid-infrared light may for example have a wavelength in the range from 3 microns to 8 microns. The photo-mask includes an opaque portion shielded by black ink and a transparent portion, with the opaque portion corresponding to a circuit pattern of the circuit board. The mid-infrared light penetrates the transparent portion and irradiates the heat-curable adhesive. The mid-infrared light is reflected or absorbed by the opaque portion. The electrically conductive particles move when irradiated by the mid-infrared light, so that the density of the electrically conductive particles in the heat-curable adhesive changes. In particular, the irradiated electrically conductive particles migrate towards regions where there is no irradiation by the mid-infrared light. Thereby, the activated electrically conductive particles move under the opaque portion of the photo-mask, with the electrically conductive particles relocating themselves one by one. The repositioned electrically conductive particles form a pattern similar to or the same as the pattern of the opaque portion of the photo-mask.

In step S34, the heat-curable adhesive layer is hardened by a baking process, the heat-curable adhesive layer solidifies after heating, and a single-layer circuit board is thus manufactured.

In step S35, a multilayer circuit board is manufactured by bonding two or more insulating substrates together. Each insulating substrate includes two major surfaces at two opposite sides thereof, respectively, and a circuit pattern is formed on at least one of the two surfaces of the insulating substrate by the above-mentioned method. For each two adjacent insulating substrates bonded together, the bonding side of one of the insulating substrates has a circuit pattern formed thereat, and the bonding side of the other insulating substrate has no circuit pattern formed thereat (i.e. it is bare). During the bonding process, a prepreg is put between two adjacent insulating substrates. Then the two adjacent insulating substrates are pressed together by a pressing machine to obtain a multilayer circuit board. In the case where the multilayer circuit board to be obtained includes three or more insulating substrates, the above-described putting and pressing processes are repeated as many times as is necessary to finally obtain the bonded stack of insulating substrates. That is, the number of layers of the multilayer circuit board can be configured according to particular requirements.

The mid-infrared light can be obtained by self-initiated volume discharge technology.

The heat-curable adhesive may be a one-component heat-curable epoxy adhesive. The one-component heat-curable epoxy adhesive series includes surface mount technology (SMT) surface mount adhesives, integrated circuit (IC) molding adhesives, underfill adhesives, one-component epoxy resin structural adhesives, and similar adhesives.

In the present embodiment, the circuit pattern is formed by the electrically conductive particles migrating under irradiation by the mid-infrared light. Therefore, the danger of environmental pollution normally associated with circuit board manufacture is reduced or even eliminated.

The method herein is not limited to the above-described embodiment. For example, the emission of mid-infrared light can instead be precisely controlled in terms of the surface area(s) illuminated and the intensity of illumination. In such case, the photo-mask need not be used, and the electrically conductive particles migrate to any area where there is no mid-infrared light irradiation.

Figure 2:
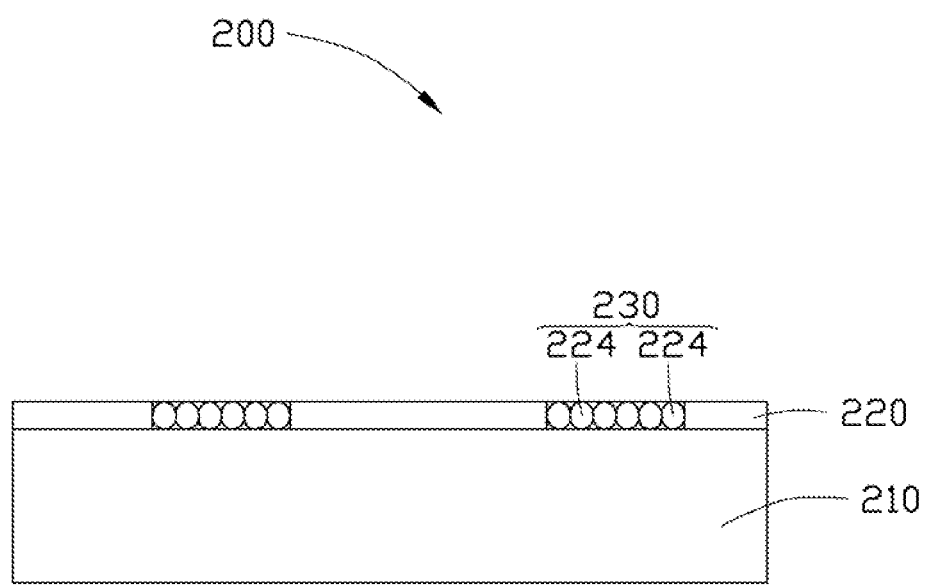
FIG. 2 is a cross-sectional view of part of a single layer circuit board also made substantially according to the method of FIG. 1.

Referring to FIG. 2, part of a single layer circuit board obtained using the above-mentioned method is shown. The single layer circuit board 200 includes an insulating substrate 210, and a hardened heat-curable adhesive layer 220 attached on the surface of the insulating substrate 210. As seen, what started off as a liquid heat-curable adhesive layer with electrically conductive particles 224 mixed therein has been transformed into the hardened heat-curable adhesive layer 220 with a circuit pattern 230, by migration of the electrically conductive particles 224 one by one. The particular profile of the circuit pattern 230 is a matter of design choice.

Figure 3:
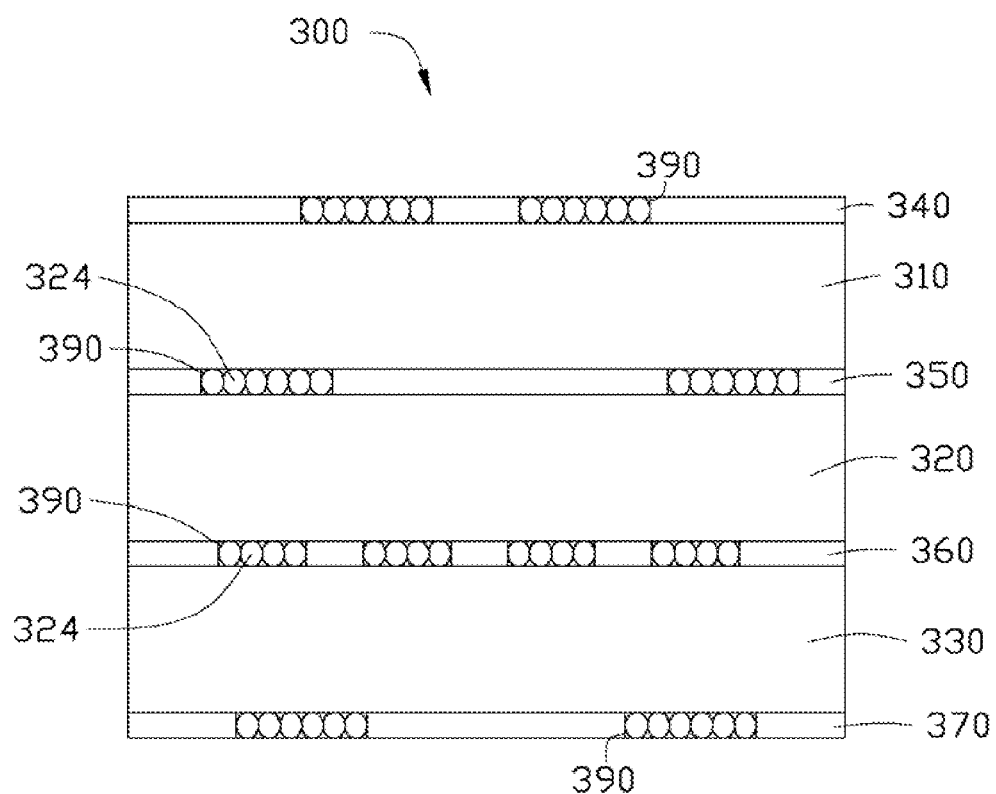
FIG. 3 is a cross-sectional view of part of a multilayer circuit board made according to the method of FIG. 1.
Figure 4:
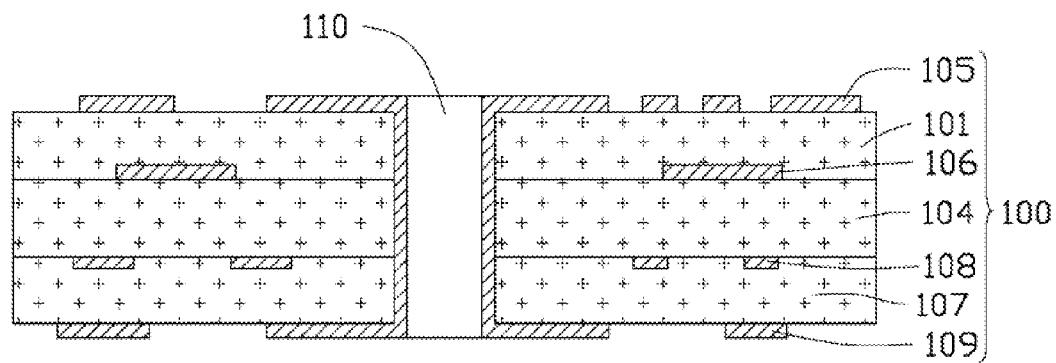
FIG. 4 is a cross-sectional view of part of a typical multilayer circuit board.
Figure 5:
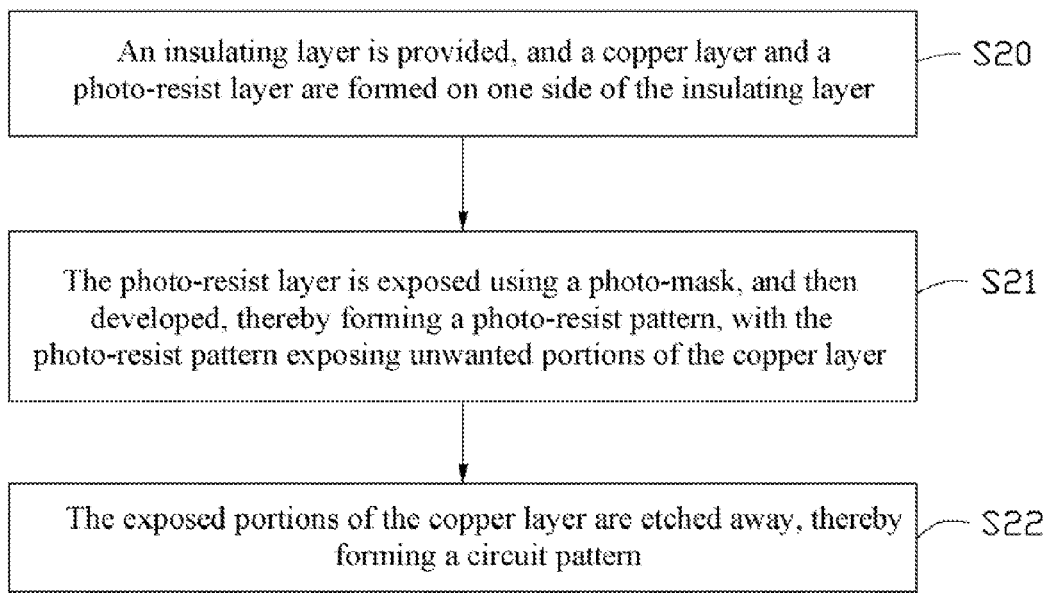
FIG. 5 is a flowchart summarizing a typical method for fabricating a circuit pattern on an insulating layer, in order to obtain the multilayer circuit board of FIG. 4.

Referring to FIG. 3, part of a multilayer circuit board obtained using the above-mentioned method is shown. The multilayer circuit board 300 includes three insulating substrates 310, 320 and 330, and four hardened heat-curable adhesive layers 340, 350, 360 and 370. As seen, what started off as four liquid heat-curable adhesive layers with electrically conductive particles 324 mixed therein has been transformed into the four hardened heat-curable adhesive layers 340, 350, 360 and 370 each with a circuit pattern 390, by migration of the electrically conductive particles 324 one by one. The four hardened heat-curable adhesive layers 340, 350, 360 and 370 and three insulating substrates 310, 320 and 330 are stacked and sandwiched together in alternating fashion. The four hardened heat-curable adhesive layers 340, 350, 360 and 370 are disposed on corresponding surfaces of the three insulating substrates 310, 320 and 330, with each of the three insulating substrates 310, 320 and 330 in contact with and sandwiched between two corresponding of the hardened heat-curable adhesive layers 340, 350, 360 and 370. Each of the hardened heat-curable adhesive layers 340, 350, 360 and 370 has the electrically conductive particles 324 therein, with the electrically conductive particles 324 forming the circuit pattern 390.

One or more through holes (not shown) can be defined in one or more parts of the multilayer circuit board 300, and a wall of each through hole can be coated with electrically conductive material to form a via. The via thereby electrically interconnects selected circuit patterns 390 of selected of the hardened heat-curable adhesive layers 340, 350, 360 and 370. For example, vias can electrically interconnect circuit patterns 390 of the hardened heat-curable adhesive layers 340 and 350, the hardened heat-curable adhesive layers 350 and 360, the hardened heat-curable adhesive layers 360 and 370, and the hardened heat-curable adhesive layers 340 and 370.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method for manufacturing a circuit board, the method comprising:
   obtaining an insulating substrate, liquid heat-curable adhesive, and electrically conductive particles, the electrically conductive particles being movable in the heat-curable adhesive under irradiation by mid-infrared light;
   adding the electrically conductive particles into the heat-curable adhesive;
   activating the electrically conductive particles in the heat-curable adhesive by electrical discharge;
   spreading the heat-curable adhesive having the activated electrically conductive particles on the insulating substrate to form a heat-curable adhesive layer on the insulating substrate;
   exposing the heat-curable adhesive layer to mid-infrared light by using a photo-mask, the photo-mask having a pattern corresponding to a desired circuit pattern of the circuit board, wherein the electrically conductive particles relocate themselves one by one to form the circuit pattern under the irradiation by the mid-infrared light; and
   hardening the heat-curable adhesive layer.

2. The method of claim 1, wherein the electrically conductive particles move when irradiated by the mid-infrared light, and the density of the electrically conductive particles in the heat-curable adhesive thereby changes, with the irradiated electrically conductive particles migrating towards regions of the heat-curable adhesive where there is no irradiation by the mid-infrared light.

3. The method of claim 2, wherein the photo-mask comprises an opaque portion and a transparent portion, and the mid-infrared light transmits through the transparent portion and is reflected or absorbed by the opaque portion.

4. The method of claim 3, wherein the opaque portion is shielded by black ink, and corresponds to the circuit pattern.

5. The method of claim 1, wherein after the hardening process, a single-layer circuit board is achieved, and the method further comprises: repeating the obtaining, the adding, the activating, the spreading, the exposing, and the hardening one or more times as necessary to achieve a total of a plurality of single-layer circuit boards, wherein for each single-layer circuit board, the insulating substrate has two major surfaces at two opposite sides thereof, respectively, and a circuit pattern is formed on at least one of the two surfaces of the insulating substrate; and bonding the single-layer circuit boards together to achieve a multilayer circuit board.

6. The method of claim 5, wherein for each two adjacent insulating substrates bonded together, the bonding side of one of the insulating substrates has a circuit pattern formed thereat, and the bonding side of the other insulating substrate has no circuit pattern formed thereat; and a prepreg is put between each two adjacent insulating substrates, and then the two adjacent insulating substrates are pressed together by a pressing machine, whereby the multilayer circuit board is obtained.

7. The method of claim 1, wherein the heat-curable adhesive is one-component heat-curable epoxy adhesive.

8. The method of claim 7, wherein the one-component heat-curable epoxy adhesive is selected from the group consisting of surface mount technology (SMT) surface mount adhesive, integrated circuit (IC) molding adhesive, underfill adhesive, one-component epoxy resin structural adhesive, and any combination thereof.

9. The method of claim 1, wherein the mid-infrared light is obtained by self-initiated volume discharge technology.

10. The method of claim 1, wherein the electrically conductive particles are metal particles.

11. The method of claim 1, wherein hardening the heat-curable adhesive layer comprises baking the heat-curable adhesive layer.

\* \* \* \* \*